(12) United States Patent
Dinan

(10) Patent No.: US 7,970,920 B1
(45) Date of Patent: Jun. 28, 2011

(54) DYNAMIC TWO-DIMENSIONAL CODING FOR APPLICATIONS

(75) Inventor: Esmail Dinan, Herndon, VA (US)

(73) Assignee: Clear Wireless LLC, Kirkland, WA (US)

( * ) Notice: Subject to any disclaimer, the term of this patent is extended or adjusted under 35 U.S.C. 154(b) by 205 days.

(21) Appl. No.: 12/334,705

(22) Filed: Dec. 15, 2008

(51) Int. Cl.
*G06F 15/16* (2006.01)
(52) U.S. Cl. ...................... 709/230
(58) Field of Classification Search .................... 709/230
See application file for complete search history.

(56) References Cited

U.S. PATENT DOCUMENTS

| | | | | |
|---|---|---|---|---|
| 7,602,748 | B2 * | 10/2009 | Sinnreich et al. | 370/331 |
| 7,616,658 | B2 * | 11/2009 | Harada et al. | 370/465 |
| 7,634,016 | B2 * | 12/2009 | Hassan et al. | 375/261 |
| 2004/0017860 | A1 | 1/2004 | Liu | |
| 2004/0179605 | A1 * | 9/2004 | Lane | 375/240.18 |
| 2005/0226268 | A1 * | 10/2005 | Wang et al. | 370/465 |

OTHER PUBLICATIONS

Wang et al., "System Architecture and Cross-layer Optimization of Video Broadcast over WiMAX," IEEE Journal on Selected Areas in Comunications, May 2007, vol. 35, No.4.
Domanski et al., "Modified MPEG-2 Video Coders with Efficient Multi-Layer Scalability," Poznan University of Technology, Institute of Electronics and Telecommunications.

* cited by examiner

*Primary Examiner* — Jeffrey Pwu
*Assistant Examiner* — Saad A Waqas
(74) *Attorney, Agent, or Firm* — McDonnell Boehnen Hulbert & Berghoff LLP

(57) ABSTRACT

Disclosed herein are methods and systems for selecting a coding scheme for application-session content in an application session between a server and a client device. In an exemplary embodiment, the client device receives application-session content from the server via a communication path that comprises a wireless link. An exemplary method may involve (a) at the client device, determining current values of one or more quality-of-service indicators, wherein the quality-of-service indicators are indicative of quality of service over the wireless link; and (b) using the current values of the quality-of-service indicators as a basis for selecting a coding scheme that should be used to encode forthcoming applicant-session content. Further, if the selected coding scheme differs from the coding scheme being used by the server, the client device may request that the application server use the selected coding scheme.

16 Claims, 9 Drawing Sheets

| CINR (db) | CQI | DL MCS | MIMO |
|---|---|---|---|
| <=3 | 0 | QPSK 1/12 | STC |
| -2 | 1 | QPSK 1/12 | STC |
| -1 | 2 | QPSK 1/8 | STC |
| 0 | 3 | QPSK 1/8 | STC |
| 1 | 4 | QPSK 1/4 | STC |
| 2 | 5 | QPSK 1/4 | STC |
| 3 | 6 | QPSK 1/4 | STC |
| 4 | 7 | QPSK 1/4 | STC |
| 5 | 8 | QPSK 1/2 | STC |
| 6 | 9 | QPSK 1/2 | STC |
| 7 | 10 | QPSK 1/2 | STC |
| 8 | 11 | QPSK 3/4 | STC |
| 9 | 12 | QPSK 3/4 | STC |
| 10 | 13 | QPSK 3/4 | STC |
| 11 | 14 | 16QAM 1/2 | STC |
| 12 | 15 | 16QAM 1/2 | STC |
| 13 | 16 | 16QAM 1/2 | STC |
| 14 | 17 | 16QAM 3/4 | STC |
| 15 | 18 | 16QAM 3/4 | STC |
| 16 | 19 | 16QAM 3/4 | STC |
| 17 | 20 | 64QAM 2/3 | STC |
| 18 | 21 | 64QAM 2/3 | STC |
| 19 | 22 | 64QAM 3/4 | STC |
| 20 | 23 | 64QAM 5/6 | STC |
| 21 | 24 | 64QAM 5/6 | STC |
| 22 | 25 | 64QAM 5/6 | STC |
| 23 | 26 | 16QAM 3/4 | SM |
| 24 | 27 | 16QAM 3/4 | SM |
| 25 | 28 | 64QAM 2/3 | SM |
| 26 | 29 | 64QAM 2/3 | SM |
| 27 | 30 | 64QAM 3/4 | SM |
| >=28 | 31 | 64QAM 5/6 | SM |

FIG. 2A

| MCS | bits/symbol | symbols/slot | Spectral Efficiency (bits/slot) |
|---|---|---|---|
| QPSK 1/8 | 0.25 | 48 | 12 |
| QPSK 1/4 | 0.5 | 48 | 24 |
| QPSK 1/2 | 1 | 48 | 48 |
| QPSK 3/4 | 1.5 | 48 | 72 |
| 16QAM 1/2 | 2 | 48 | 96 |
| 16QAM 3/4 | 3 | 48 | 144 |
| 64QAM 1/2 | 3 | 48 | 144 |
| 64QAM 2/3 | 4 | 48 | 192 |
| 64QAM 3/4 | 4.5 | 48 | 204 |
| 64QAM 5/6 | 5 | 48 | 240 |

FIG. 2B

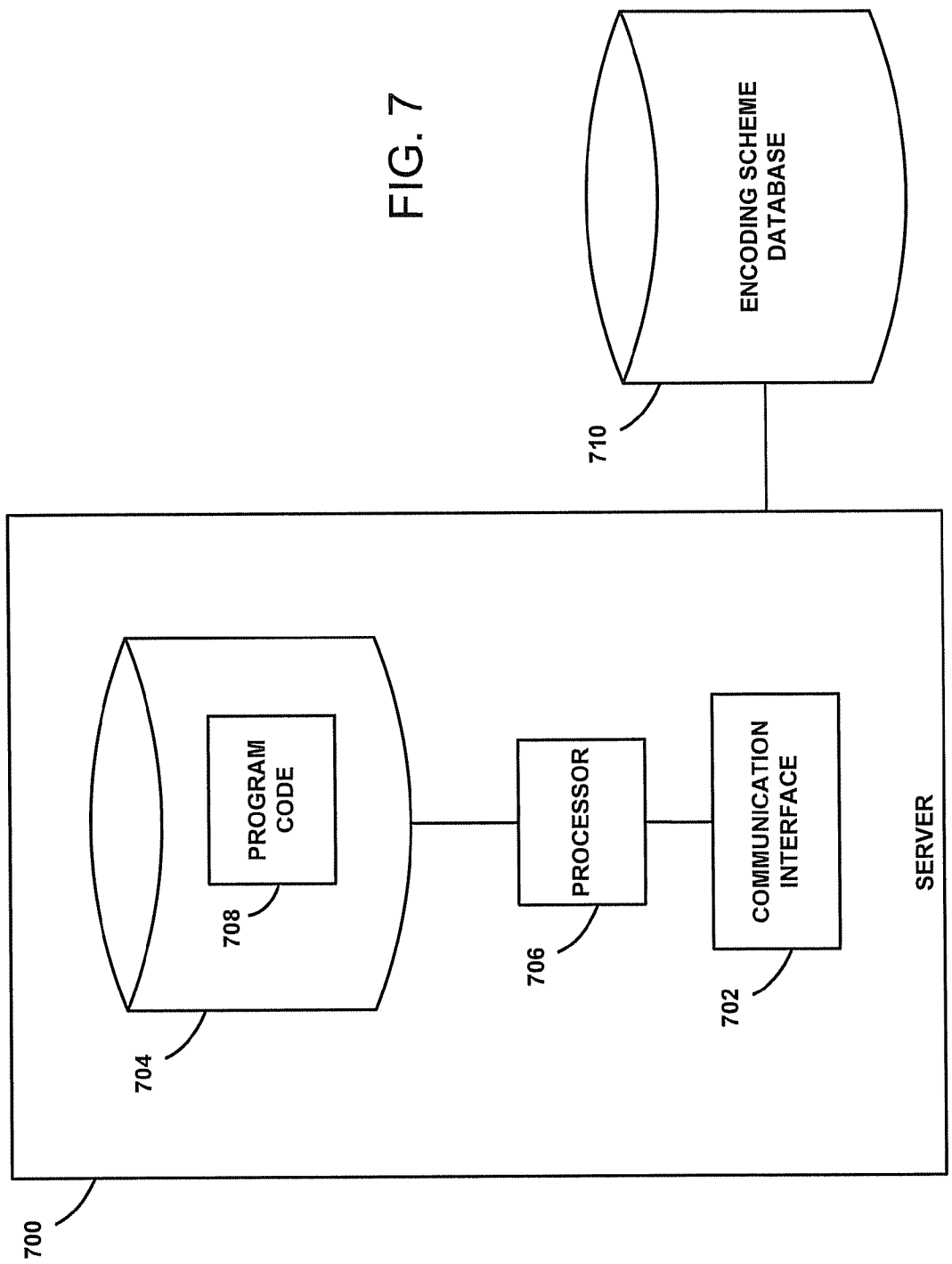

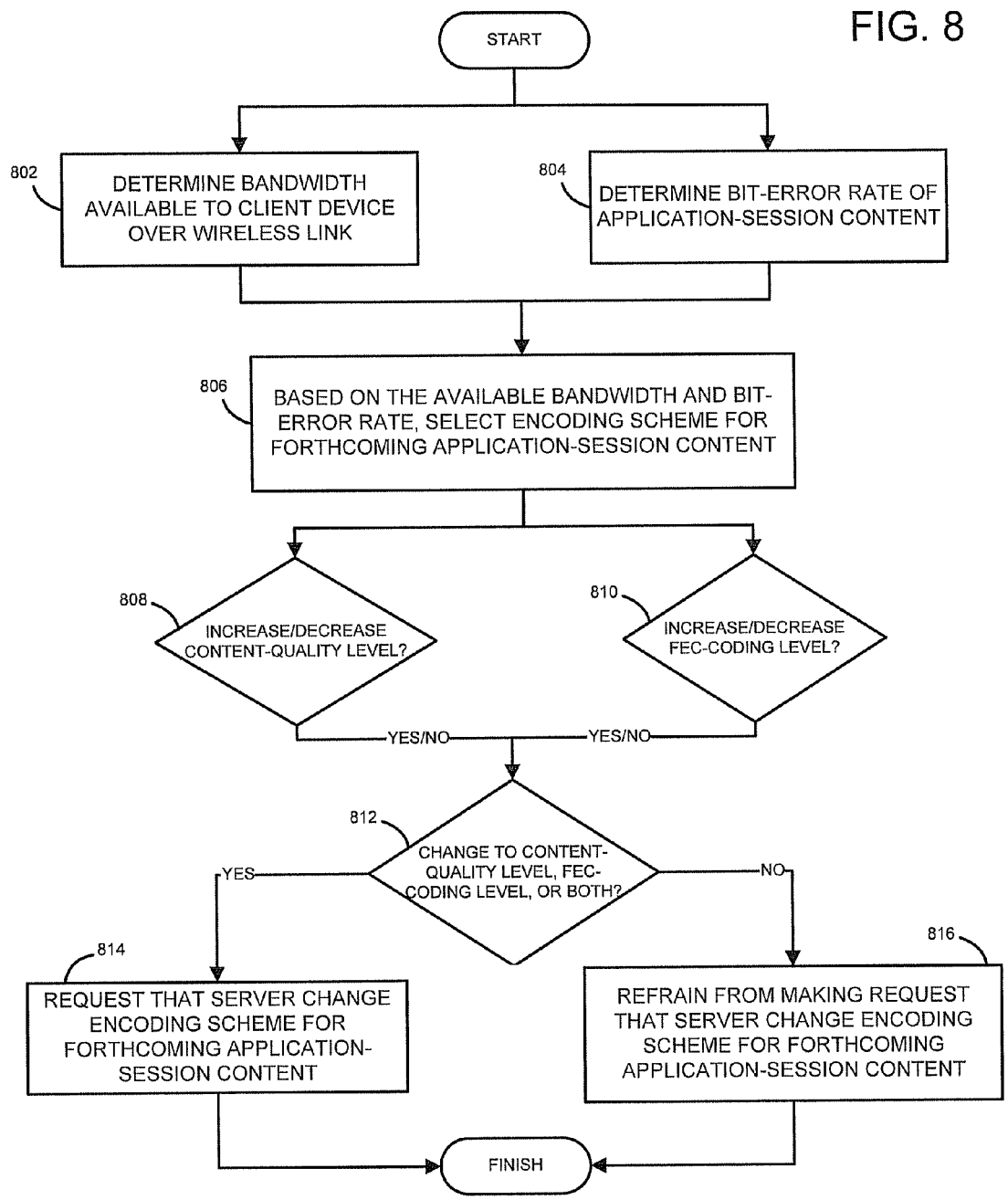

DYNAMIC TWO-DIMENSIONAL CODING FOR APPLICATIONS

BACKGROUND

Wireless access networks are providing increasingly fast packet-data connections for client devices using air-interface protocols such as WiMAX and 1xEV-DO. As a result, client devices such as cellular telephones, mp3 players, and personal digital assistants (PDAs), among others, are able to access data content of ever-increasing quality, including higher-quality content that was previously unavailable to such devices due to the bandwidth constraints of wireless access networks.

In wireless access networks, bandwidth is typically a scarce resource as compared to most wire-line networks, the availability of which may change dynamically. More specifically, as a result of variable fading and shadowing that typically occurs in wireless access networks, the network resources that are available for communications may change dynamically. Each client device may therefore experience a different and unique air interface, with varying RF signal quality depending on the location of the client device. The variability of the traffic load in an access network may further contribute to the variability of signal quality experienced in wireless access networks. Due to the variability of wireless service, the traffic bit-error rate may be significantly higher over wireless links, as compared to landline or wireline links.

OVERVIEW

Many applications are developed assuming reliable end-to-end links. This assumption may be relatively accurate when a communication path consists entirely of wire-line links. However, such applications may not adapt well in a rapidly changing wireless environment. Thus, the end user's experience may be less than desirable when a wireless link is introduced in a communication path. Accordingly, methods and systems that allow a server to dynamically adjust coding in response to variable air-interface conditions are disclosed herein. In an exemplary embodiment, a client device and/or server may employ various two-dimensional multi-layer coding schemes, and dynamically select which coding scheme should be employed according to the quality of service being experienced by the client device.

In one aspect, a method for selecting a coding scheme for application-session content in an application session between a server and a client device is disclosed. The application-session content in the application session may be received from the server via a communication path that includes a wireless link. The method involves (a) at the client device, determining values of one or more quality-of-service indicators, wherein the quality-of-service indicators are indicative of quality of service over the wireless link and (b) using the values of the quality-of-service indicators as a basis for selecting a coding scheme that should be used to encode forthcoming applicant-session content. The method may further involve requesting that the selected coding scheme be used to encode the forthcoming application-session content.

In an exemplary embodiment, determining the current values of the one or more quality-of-service indicators may involve (a) determining an amount of bandwidth that is currently available to the client device over the wireless link in the communication path and (b) determining a current bit-error rate for application-session content received from the server. Accordingly, using the values of the one or more quality-of-service indicators as a basis for selecting the coding scheme may involve (a) using the determined amount of available bandwidth as a basis for selecting a data format that should be used by the server for the forthcoming application-session content and (b) using the determined bit-error rate as a basis for selecting an amount of forward-error-correction that the server should provide for forthcoming applicant-session content.

In another aspect, a method for selecting a coding scheme for application-session content in an application session between a server and a client device is disclosed. The application-session content may be sent to the client device via a communication path that includes a wireless link. The method involves (a) at the server, receiving current values of one or more quality-of-service indicators, wherein the quality-of-service indicators are indicative of quality of service over the wireless link; (b) using the current values of the quality-of-service indicators as a basis for selecting a coding scheme that should be used to encode forthcoming applicant-session content; and coding the forthcoming application-session content using the selected coding scheme.

In another aspect, a system configured to select a coding scheme for application-session content in an application session between a server and a client device is disclosed. The application-session content in the application session may be received from the server via a communication path that includes a wireless link. The system comprises (a) a communication interface; (b) a processor; and (c) program code stored in data storage and executable by the processor to: (i) determine current values of one or more quality-of-service indicators, wherein the quality-of-service indicators are indicative of quality of service over the wireless link; (ii) use the current values of the quality-of-service indicators as a basis for selecting a coding scheme that should be used to encode forthcoming applicant-session content; and (iii) send a request to the server via the communication interface to request that the server apply the selected coding scheme to the forthcoming application-session content. In an exemplary embodiment, the system takes the form of a client device connected to an access network under the WiMAX protocol.

In another aspect, a system configured to select a coding scheme for application-session content in an application session between a server and a client device is disclosed. The system comprises (a) a communication interface; (b) a processor; and (c) program code stored in data storage and executable by the processor to: (i) send the application-session content to the client device via a communication path that comprises a wireless link; (ii) receive current values of one or more quality-of-service indicators from the client device, wherein the quality-of-service indicators are indicative of quality of service over the wireless link; (iii) use the current values of the quality-of-service indicators as a basis for selecting a coding scheme that should be used to encode forthcoming applicant-session content; and (iv) encode the forthcoming application-session content using the selected coding scheme. In an exemplary embodiment, the system takes the form of a server configured to engage in an application session.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

An exemplary embodiment of the present invention is described herein with reference to the drawings, in which:

FIG. 2A is a table showing various modulation and coding schemes according to an exemplary embodiment;

FIG. 2B is a table showing the spectral efficiency for various MCS, according to an exemplary embodiment;

FIG. 7 is a block diagram illustrating a server according to an exemplary embodiment; and FIG. 8 is another flow chart illustrating a method for selecting a coding scheme for application-session content, according to an exemplary embodiment.

DETAILED DESCRIPTION

Methods and systems for dynamically selecting a coding scheme for application-session content are described herein with reference to an exemplary embodiment. An exemplary method may be implemented by a client device configured to communicate under the Worldwide Interoperability for Microwave Access (WiMAX) protocol. WiMAX is an Institute of Electrical and Electronics Engineers (IEEE) standard, designated 802.16, with the 802.16e being the current version of the standard (the terms "IEEE 802.16," "802.16e," and "WiMAX" may be used interchangeably herein). WiMAX provides a robust mechanism for wireless communication between base stations and subscriber stations. In particular, WiMAX is designed to provide fixed, portable or non-line-of-sight service with a potential range of six miles or more, a potential bandwidth on the order of forty megabits per second, and generally superior quality of service and security. Those skilled in the art will understand that the method and apparatus may be implemented with or involve any other wired or wireless protocol such as IEEE 802.11, CDMA, and/or 1xEV-DO, among others, in addition or in the alternative to WiMAX.

WiMAX chipsets that provide for communication in accordance with the WiMAX protocol may be included as standard or optional equipment not only in traditional communications devices, such as cellular phones and personal digital assistants, but also in devices that, heretofore, were not typically used for access to telephony networks, such as portable music players, entertainment devices such as game players, automobiles, domestic appliances and so on. Herein, the terms, "client device" and "subscriber station" may be used interchangeably and should be understood to include any such traditional or non-traditional communication device. Further, it should be understood that a subscriber station does not require a subscription to fall within the scope of the invention. Further, while exemplary embodiments are described by way of example with reference to WiMAX, exemplary methods and systems may additionally or alternatively involve one or more other wired or wireless protocols such as IEEE 802.11, CDMA, 1xEV-DO, etc., without departing from the scope of the invention.

Figure 1:
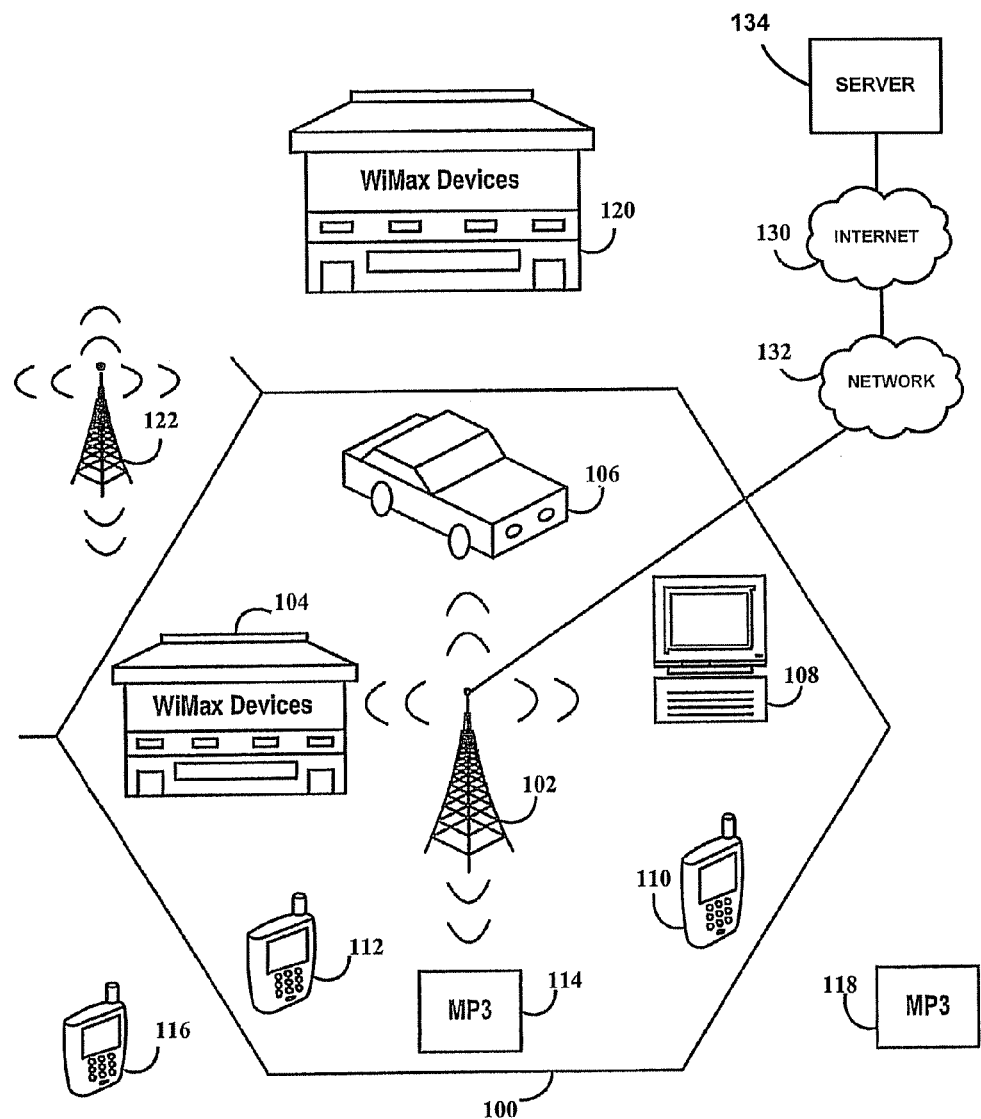
FIG. 1 is schematic representation of a coverage area where service is available from a base station, according to an exemplary embodiment.

FIG. 1 is schematic representation of a coverage area 100 where service is available from a base station 102. Also shown are a plurality of client devices that may connect to and engage in communications with base station 102. The client devices may take the form of, for example, WiMAX devices located in a building or home 104, such as computer, appliance or cell phone, WiMAX devices located in an automobile 106, a portable computer 108, a cellular telephone 110, a personal digital assistant 112, an MP3 player 114, another cell phone 116, another MP3 player 118 and/or various WiMAX devices located within an office building 120 such as computers, cell phones, game players, etc. Adjacent areas may be covered by other base stations, one of which is shown as base station 122.

A client device may engage in various types of communication when provided with a WiMAX connection via base station 102. For instance, a base station 102 may provide connectivity to a packet-switched network 130 such as the Internet, so that a client device may engage in packet-data communications. Packet-data connectivity may be provided via a service provider's network 132 or directly. In addition to packet-data connectivity, a WiMAX connection may also provide access to other services such as voice-over-IP (VoIP) and digital television, among others.

Information transmitted wirelessly from base station 102 to a client device may be coded and modulated before transmission. The particular coding and modulation used for a given transmission is referred to as the modulation and coding scheme (MCS) for the transmission. FIG. 2A is a table showing MCSs that are currently supported by the WiMAX Standard. Each row of the table corresponds to a different MCS. It should be understood that the scope of the invention should not be limited to current MCSs as the embodiments described herein may be implemented regardless of the MCSs used for WiMAX communications.

Referring to the table of FIG. 2A, MCSs that are coded using more bits are generally more reliable. In addition, modulation schemes using more power per bit of information transferred are also more reliable and may reach users at a greater distance from a transmitting base station. Thus, MCSs towards the top of the table, which employ more bits and/or more power per bit, are more efficient. However, these MCSs towards the top of the table (referred to as "lower MCS") are less efficient in term of network resource usage. Lower MCSs, such as QPSK 1/8 for instance, use network resources less efficiently, but also have less stringent signal-to-noise requirements (e.g., CINR).

Referring back to FIG. 1, server 134 sits as a node on packet-switched network 130. The client device may connect to a server 134 via the service provider's network 132 and the packet-switched network 130. The communication path used for communications between a client device and server 134 may be said to include a series of links (not all of which are necessarily illustrated) that collectively define the communication path. The communication path may include wireline links, wireless links, or a combination of wireline and wireless links. For example, a client device may engage in an application session with server 134 via a communication path that includes base station 102, service provider's network 132, and packet-switched network 130. This communication path includes a wireless link (e.g., a link over an air interface) between the client device and base station 102, as well as a number of wired and/or wireless links in the service provider's network 132 and packet-switched network 130. Many other communication paths are possible. In fact, it should be understood, that the client device may connect to the server 134 via any communication path available to the client device, without departing from the scope of the invention.

Server 134 may be configured to provide data content a client device for use with a particular client-side application such as an internet browser, media player or a video game, among others. The server 134 may be accessed by a single client device or multiple client devices. Further, the server 134 may allow for multiple client devices running an application to interact with each other via the server, such as when a server hosts a video game. Alternatively, server 134 may simply host media that can be downloaded by or streamed to a client device.

A client device using a given application to connect to a server 134 may be said to be engaged in or participating in an "application session," which may include a series of interrelated unidirectional, bidirectional, or even multidirectional communications between the server 134 and one or more client devices. Data content that is transmitted to a client device during an application session may be referred to generally as "application-session content". For example, a client device may access a streaming video broadcast or multicast through an application such as a web browser or media player. As another example, a client device running a video game application may access a game server, and participate in a round of the video game, or interrelated rounds of the video game, hosted by the server. The communications that occur during the course of the broadcast, multicast, or video game (i.e., transmissions of application-session content) may be considered part of an application session. While an application session typically includes multiple, related communications, it should be understood that an application session may include a single communication or possibly a series of unrelated communications between the client device and the server, without departing from the scope of the invention.

In a further aspect, the server 134 may be configured to encode and/or format application-session content. In particular, to account for errors that occur in the communication path between server 134 and a client device, server 134 may be configured to provide forward error correction (FEC) for application-session content. For example, various block FEC coding schemes, such as Reed-Solomon coding or Turbo coding, may be used to encode application-session content. Other examples are also possible. Various techniques for FEC coding are well know to those skilled in the art, and any such technique may be employed, without departing from the scope of the invention.

It should be understood that the application-layer coding performed by server 134 (e.g., multi-layer coding) is separate from coding performed according to WiMAX (e.g., coding according to a MCS) or any other air interface protocol. As such, application-layer coding may be applied to application-session content by server 134. The application-session content may then be sent along a communication path that includes a base station 102. At base station 102, the application-session content may be further encoded for transmission from base station 102 to a client device. The coding applied by base station 102 for transmission to a client device, such as a WiMAX MCS, may be referred to as "transport-layer" or "air-interface" coding.

In an exemplary embodiment, the server 134 employs two-dimensional multi-layer coding, which incorporates forward error correction, to encode application-session content. When application-session content is encoded using two-dimensional multi-layer coding, the application-session content is formatted into frames, which each include one or more "layers" of data. Each layer of data may include application-session content and/or one or more forward-error correction (FEC) codes. These encoded data frames may be transmitted to the client device via the packet-switched network 130, the service provider's network 132, and the wireless link 136 between base station 102 and the client device. It should be understood that while the disclosure generally refers to exemplary embodiments incorporating two-dimensional multi-layer coding, multi-layer coding schemes of various dimensions may be employed without departing from the scope of the invention.

Use of multi-layer coding provides flexibility for server 134, allowing it to adjust the amount of forward error correction provided for application-session content. More specifically, the server can vary the amount of forward error correction according to the characteristics of the communication path for application-session content. For example, a path consisting entirely of wireline links may have relatively few channel errors, while wireless links, such as that between client devices and base station 102, may introduce more significant channel errors. As such, more forward error correction may be required to provide the same error-correcting capabilities over a wireless link, as compared to a wireline link. Further, the quality of service over a wireless link (e.g., the bandwidth available for an application session) may vary over time, and thus, the amount of forward error correction required to provide the same error-correcting capabilities may also vary over time. According to an exemplary embodiment, the server 134 may dynamically adjust the amount of forward error correction provided by changing the number of layers in a frame and/or the changing the number of forward error correction codes included in each layer.

Figure 3:
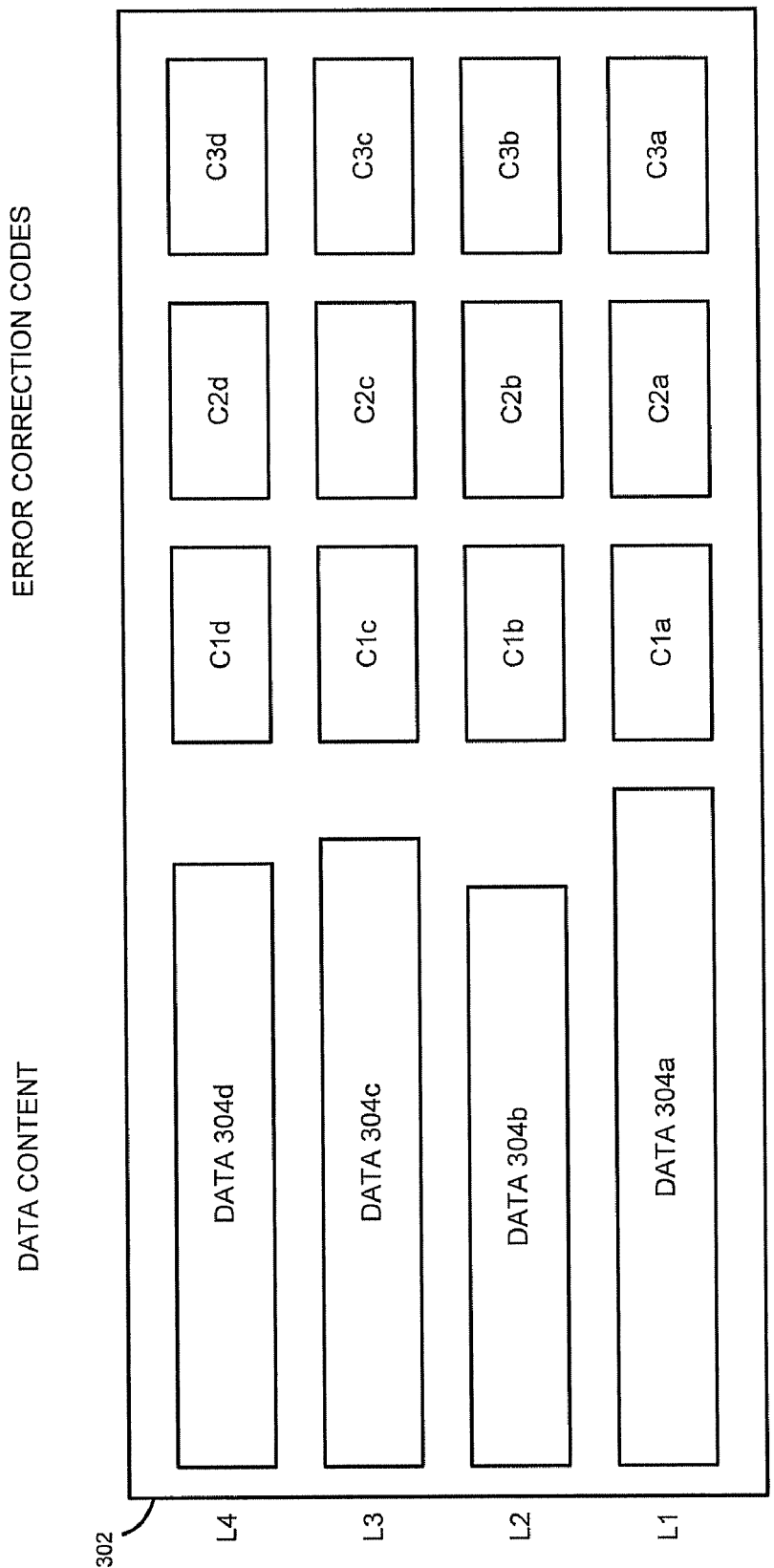
FIG. 3 is a visual representation of the data format resulting from two-dimensional multi-layer coding, according to an exemplary embodiment.

FIG. 3 is a visual representation of the data format resulting from two-dimensional multi-layer coding, such as that performed by server 134. The server may divide data content into frames, such as frame 302, which includes a number of layers L1-L4. Each layer L1-L4 includes data content, and one or more forward error correction (FEC) codes. For example, layer L1 of frame 302 includes data content 304a and FEC codes C1a-C3a, layer L2 includes data content 304b and FEC codes C1b-C3b, and so on. The FEC codes in a given layer provide error correction for the data content in that layer (e.g., FEC codes C1a-C3a-C1d-C3d provide error correction for data content 304a-data content 304d, respectively). It should be understood that while four layers are depicted, the number of layers may vary. Further, the size of (i.e., the amount of data content included in) each layer may be the same or may vary from layer to layer in a given frame. Yet further, the number of FEC codes in each layer may vary, and the size of each FEC code may also vary.

Including more layers in a frame and/or more data content in each layer, generally allows for transmission of higher-quality content. However, more bandwidth is typically required in order to accommodate the higher-quality content. Further, additional FEC codes and/or longer FEC codes may be required in order to maintain the same level of error correction for higher-quality content, as compared to lower-quality content. Since FEC codes are overhead (e.g., not data content), increasing the number of FEC codes in the frame and/or increasing the size of a given FEC code may reduce the quality of data content that can be provided, given a fixed amount of bandwidth. As a result, additional bandwidth may be required to improve error correction, if the content quality is to be maintained.

In a further aspect, (a) "content coding" levels and/or (b) "FEC coding" levels may be defined. Generally, content coding levels may be used by a client device and/or a server to request or specify the quality of application-session content, or bandwidth to be used for transmission of application-session content. Further, FEC-coding levels may be used by a client device and/or a server to specify an amount of forward error correction to be provided for application-session content.

In an exemplary embodiment, each content coding level indicates the number of layers in a frame and/or the amount of data to be included in each layer. Higher content-coding levels may define a frame structure including more layers and/or more data content in each layer. Similarly, each FEC-coding level may specify the number of FEC codes to be included in each layer of a frame and/or the size of the included FEC codes. For example, a first FEC-coding level might correspond to the use of two FEC codes in each layer, a second FEC-coding level might correspond to the use of three FEC codes in each layer, a third FEC-coding level might correspond to the use of four FEC codes in each layer, and so on. Other examples are also possible.

A client device may request a higher content-coding level when the client desires, for example, higher-resolution video content and/or video content with an increased frame rate. As another example, a client device may request a higher content-coding level when the client device detects that additional bandwidth is available. Similarly, higher FEC-coding levels may provide for additional error correction through use of additional and/or larger FEC codes. Therefore, a client device may request a higher FEC coding level when the client is experiencing a bit-error rate beyond that which is desirable (and possibly beyond that which is tolerable) for a given application.

In practice, a given content-coding level may correspond to a particular content format. For instance, one content-coding level might correspond to video with a resolution of 800×600 pixels (and thus may specify that the video be encoded using one layer), while another content-coding level might correspond to the same video content with a resolution of 1024× 768 (and thus may specify that the video be encoded using two layers).

Figure 4:
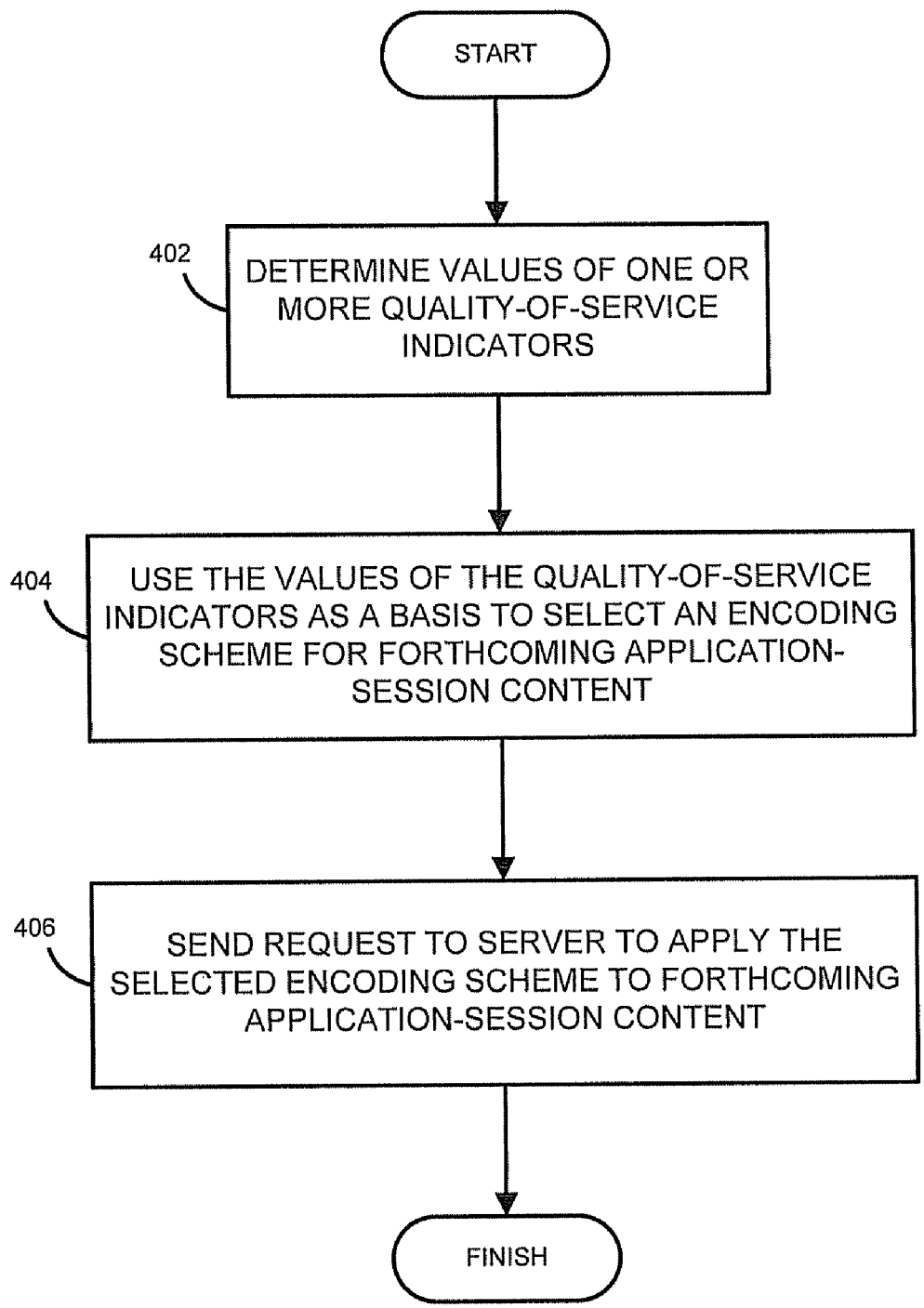
FIG. 4 is a flow chart illustrating a method for selecting a coding scheme for application-session content, according to an exemplary embodiment.

FIG. 4 is a flow chart illustrating a method for selecting a coding scheme for application-session content, according to an exemplary embodiment. The method may be performed by a client device during an application session between a server and the client device, and the application-session content may be received from the server via a communication path that includes a wireless link. The method involves the client device determining values of one or more quality-of-service indicators, each of which is indicative of the quality of service over the wireless link, as shown by block 402. The client device may then use the quality-of-service indicators to select a coding scheme for forthcoming applicant-session content, as shown by block 404. A request may then be sent to the server requesting that the server apply the selected coding scheme to forthcoming application-session content, as shown by block 406.

In an exemplary embodiment, the amount of bandwidth that is available to the client device over the wireless link may be a quality-of-service indicator. Accordingly, determining the values of the one or more quality-of-service indicators may involve, for instance, the client device determining the bandwidth that is currently available to it over the wireless link, or the average bandwidth available to it over the course of the application session or a portion thereof. As an example, for a client device operating under WiMAX, the MCS for its downlink communications (e.g., communications received at the client device from its serving base station) may be indicative of the bandwidth that is available to the client device. More specifically, each MCS has a corresponding spectral efficiency, and since spectral efficiency determines how many data bits can be transferred over radio resources (e.g., over an air-interface), the spectral efficiency is indicative of bandwidth available over a given air interface.

FIG. 2B is a table showing the spectral efficiency for various MCSs. The spectral efficiency of a given MCS is measured as the number of bits transmitted in each timeslot ("bits/slot") according to the MCS. Thus, for a given MCS, the spectral efficiency is equal to the number bits included in each symbol ("bits/symbol") multiplied by the number of symbols transmitted in each timeslot ("symbols/slot"), according to the MCS. Thus, the spectral efficiency of a given MCS (i.e., the number of bits that can be transmitted per timeslot) is indicative amount of bandwidth available under a given MCS.

Referring back to FIG. 4, the bit-error rate at the client device may additionally or alternatively be a quality-of-service indicator used in the selection of a coding scheme. To determine the bit-error rate, the client device, server, and/or another entity in the communication path may track or be informed of the number of erroneous bits received during a predetermined period of time. The bit-error rate may then be determined as equal to the number of erroneous bits received divided by the total number of bits received during that period of time. In particular, the client device may determine the bit-error rate for all application-session content received during the application session, or the bit-error rate for a portion thereof.

In an exemplary embodiment, the client device uses the quality-of-service indicators to select an appropriate coding scheme for the application session (e.g., to select the quality of the content, the number/size of layers in each frame, the amount of forward error correction, and/or the number/size of forward error correction codes). In an alternative embodiment, however, the client device may send the quality-of-service indicators to the server, and the server may select an appropriate coding scheme for forthcoming application-session content. More generally, it should be understood that much of the functionality described herein that is attributed to the client device, may also be carried out by the server, and vice versa, without departing from the scope of the invention.

Figure 5:
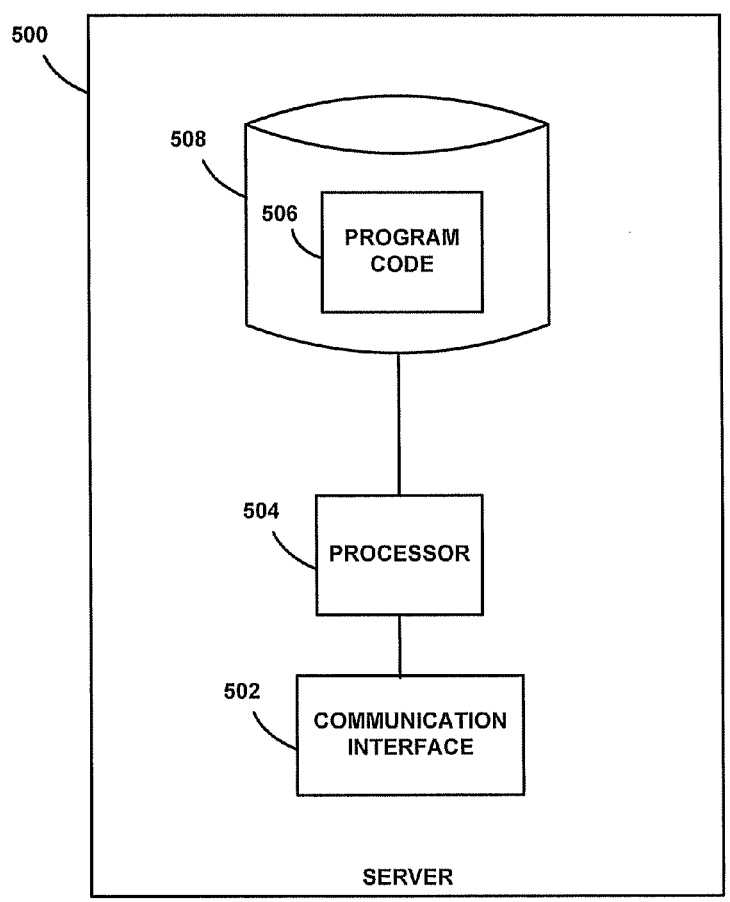
FIG. 5 is a block diagram of client device configured to select a coding scheme for application-session content, according to an exemplary embodiment.

FIG. 5 is a block diagram of a client device 500 that is configured to select a coding scheme for application-session content, according to an exemplary embodiment. During an application session between a server and the client device 500, the client device 500 may select an appropriate coding scheme, and if necessary, request that the server change the coding scheme being used for application-session content. The client device 500 includes at least one communication interface 502, a processor 504, and program code 506 that is stored in data storage 508 and executable by processor 504.

Communication interface 502 may be configured to engage in an application session and receive application-session content via a communication path that includes at least one wireless link. In some embodiments, the client device 500 may be configured to send and receive data over the wireless link under WiMAX, although other air-interface protocols may be employed with departing from the scope of the invention. Further, processor 504 may be configured to interact with communication interface 502 in order to (a) determine current values of one or more quality-of-service indicators, wherein the quality-of-service indicators are indicative of quality of service over the wireless link, (b) use the current values of the quality-of-service indicators as a basis for selecting a coding scheme that should be used to encode forthcoming applicant-session content, and (c) send a request to the server via the communication interface to request that the server apply the selected coding scheme to the forthcoming application-session content.

In a further aspect, client device 500 may include or have access to a coding scheme database (not shown). The coding scheme database may store data indicating the availability of various coding schemes for various types of applications. In particular, the coding scheme database may specify content-quality levels and/or the FEC-coding levels for various types of applications. Further, the coding scheme database may be pre-populated or updated on an as-needed basis. For instance, when the client device initiates an application session using a particular application, the client device may receive a message from the server that identifies the coding schemes that are available for the application. The client device may then store the available coding schemes in the coding scheme database.

Figure 6:
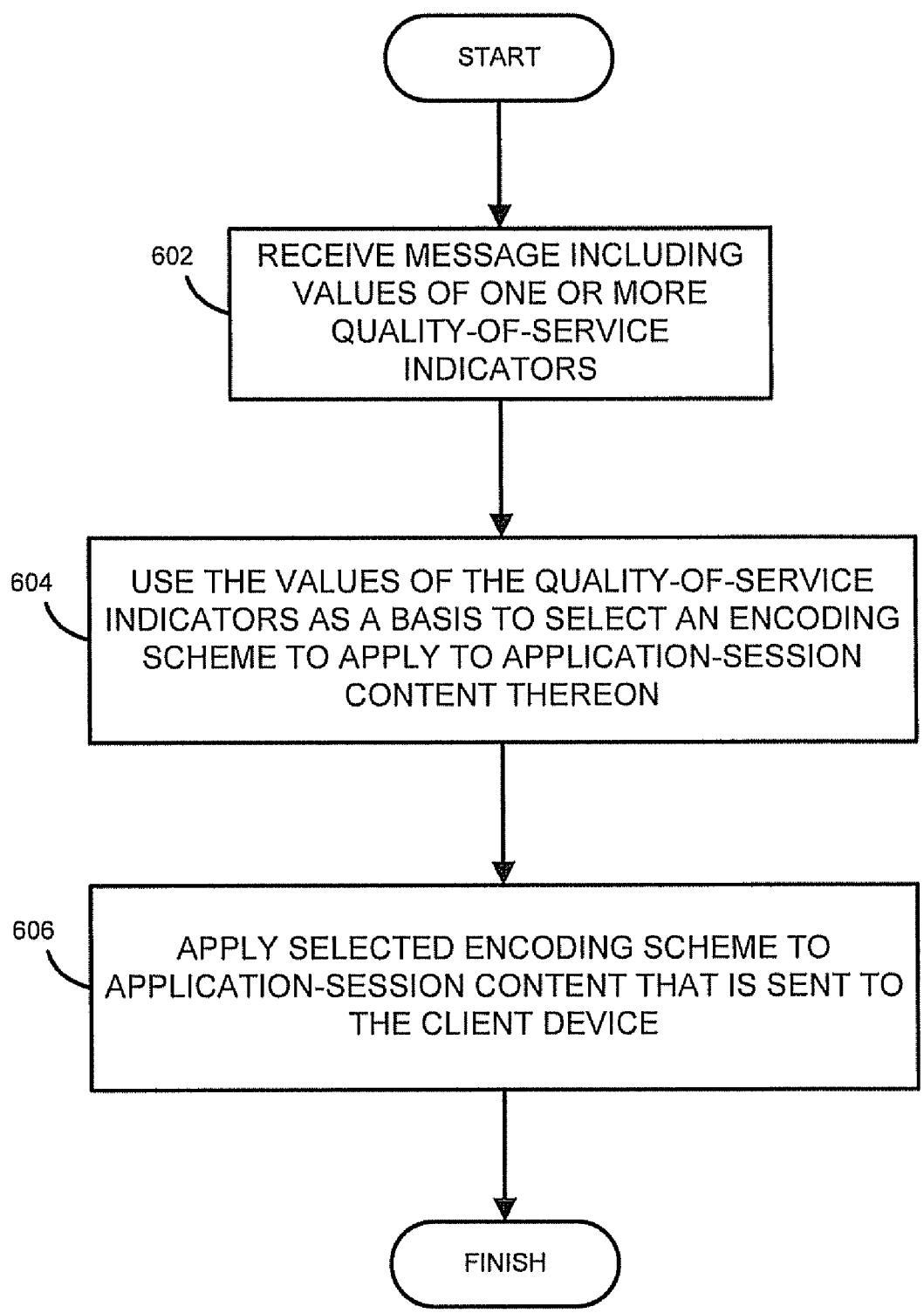
FIG. 6 is another flow chart illustrating a method for selecting a coding scheme for application-session content, according to an exemplary embodiment.

FIG. 6 is another flow chart illustrating a method for selecting a coding scheme for application-session content, according to an exemplary embodiment. The method may be carried out by a server during an application session between a server and a client device. Further, the server and the client device may engage in the application session via a communication path that includes a wireless link. The method involves the server receiving a message that provides values of one or more quality-of-service indicators for the wireless link, as shown by block 602. The server may then use the values of the quality-of-service indicators to select a coding scheme to apply to applicant-session content thereon, as shown by block 604. After selecting a coding scheme, the server may then apply the selected coding scheme to application-session content that is sent to the client device, as shown by block 606.

It should be understood that applying the selected coding scheme does not necessarily involve changing the coding scheme. In particular, the method may further involve comparing the selected coding scheme to the coding scheme that the server is already using to determine if change is appropriate. If the selected coding scheme differs from the coding scheme already in use, the server may then change the coding scheme (i.e., by using the selected encoded scheme instead). If, on the other hand, the selected coding scheme is the same as the coding scheme already in use, or has parameters (e.g., number of layers and/or FEC coding) that are substantially the same, a change in coding scheme may not be required.

FIG. 7 is a block diagram illustrating a server 700 according to an exemplary embodiment. The server 700 includes at least one communication interface 702, data storage 704, and a processor 706 that is configured to execute program code 708 stored in data storage 704. It should be understood that while server 700 is shown a single entity, the components of server 700 may be separated, without departing from the scope of the invention. For example, data storage 704 and/or may alternatively be stand-alone components that are communicatively coupled to the server so as to provide the functionality described herein. Other examples are possible.

The communication interface 702 may be configured to provide packet-data connectivity so that the server may communicate with client devices. In general, communication interface 702 may be configured to interact with processor 706 to engage in an application session with a client device via a communication path, which may include both wireline and wireless links, and to carry out various functions described herein, such as coding application-session content, receiving messages from and sending messages to a client device, selecting a coding scheme, etc.

During an application session with a client device, the server 700 may receive communications from the client device through communication interface 702. For example, the server may receive a message requesting that the server use a particular coding scheme or change to a different coding scheme for application-session content. For instance, a request from a client device may specify an FEC level and/or content-quality level, or may itself define the number of levels, the number of FEC codes, and/or the size of FEC codes. Alternatively, the server may simply receive a message from the client device that indicates the quality of service over the communication path. For example, when application-session content is sent via a communication path that includes a wireless link, the client device may send the app server a message that indicates the bandwidth available to the client device over the wireless link and/or the bit-error rate being experienced by the client device. Accordingly, server 700 may be configured to use quality-of-service indicators that indicate the quality of service over the wireless link as a basis to select a coding scheme to be applied to outgoing applicant-session content, and to then apply the selected coding scheme.

In one aspect, server 700 may be configured to encode data content sent to a client device during an application session (e.g., application-session content). In an exemplary embodiment, server 700 may be configured to use various two-dimensional multi-layer coding schemes to encode application-session content. Accordingly, the server maintains or has access to a coding scheme database 710 that indicates the various coding schemes that are available for various types of applications. As an example, for a given type of application, coding scheme database 710 may define a number of FEC levels, which each correspond to a particular number of FEC codes and/or particular size or sizes of the FEC codes. Similarly, coding scheme database 710 may define a number of content-quality levels for the given type of application, with each content-quality level corresponding to a particular number of layers.

Server 700 may also be configured to change the coding scheme being applied to application-session content in the midst of an application session. For example, the server may provide higher or lower quality content by (i) increasing or decreasing the number of layers used to encode application-session content and/or (ii) increasing or decreasing the size of one or more layers. Further, the server may provide more or less protection against channel errors by (i) increasing or decreasing the number of FEC codes used in each layer and/or (ii) increasing or decreasing the size of one or more FEC codes. Other mid-session changes to the coding scheme are also possible.

FIG. 8 is another flow chart illustrating a method for selecting a coding scheme for application-session content, according to an exemplary embodiment. In particular, the appropriate coding scheme may be selected based on the bandwidth available to the client device and the bit-error rate of application-session content. The method may be used by a client device to request changes to the quality of the application-session content and/or to the forward error correction being provided for the application-session content.

Accordingly, the method involves determining the bandwidth available to the client device over the wireless link to its serving base station, as shown by block 802. The client device also determines the current bit-error rate (bit-error rate) of the application-session content, as shown by block 804. Based on the available bandwidth and the bit-error rate, the client device selects a coding scheme that should be used for forthcoming application-session content, as shown by block 806. The client device may then compare the selecting coding scheme to the current coding scheme, and determine whether to request that the server adjust the coding scheme, as shown by blocks 808 and 810.

In particular, based at least in part on its available bandwidth, the client device determines whether or not to request an increased or decreased content-quality level from the server, as shown by block 808. If a different content-quality level and/or FEC coding level is appropriate, the client device may then request the server change the coding scheme, as shown by block 812. Similarly, the client device may determine, based at least in part on the bit-error rate, whether or not to request an increase or decrease in the FEC-coding level from the server, as shown by block 810. Then, the client device determines if a change in content-quality level and/or a change in FEC-coding level are appropriate, as shown by block 812. If a change to either is appropriate, the client device may request the server change the coding scheme accordingly for forthcoming application-session content, as shown by block 814. Otherwise the client device refrains from requesting a change to the coding scheme, as shown by block 816. By refraining the client device may allow the server to continue using the coding scheme that it was previously using.

It should be understood that there may be a tradeoff between forward-error correction and content quality, since bandwidth is a generally a limited resource, and increasing the number and/or size of FEC codes in a frame may require reducing the number and/or size of layers in the frame, and vice versa. Accordingly, the client device may consider both the available bandwidth and the current bit-error rate concurrently, so that an appropriate coding scheme may be selected. For example, maintaining a similar bit-error rate for a higher-quality content as is experienced for lower-quality content, may require additional forward error correction. As such, when the client device determines that there is available bandwidth that is going unused, and that the server should increase the content-quality level, it may select a content-quality level that does not require use of all of the unused available bandwidth. By doing so, the client device may also request that some of the unused bandwidth be used for additional forward error correction (e.g., by requesting an increase in the FEC-coding level for the application-session content). Other examples are also possible.

To ascertain whether to request a change (i.e., an increase or decrease) in content-quality level and/or FEC level, the client device may evaluate whether or not the selected coding scheme is substantially the same as the coding scheme that is currently being used for the application-session content. For instance, the client device may evaluate whether the server could make better use of the available bandwidth. Further, the client device may determine whether the bit-error rate is at an acceptable level, whether a higher bit-error rate would be tolerable and allow for transmission of higher-quality content using the same bandwidth, and/or whether a lower bit-error rate might improve the application session.

In practice, during an application session in which audiovisual content is being streamed to the client device, the client device may determine (based on its current MCS, for instance) that 500 kbps/sec of bandwidth are available over a wireless link. If the client device is currently being streamed audiovisual content at 200 kbps/sec, it may request that the server increase the content-quality level and provide the audiovisual content at 400 kbps/sec. By doing so, the user of the device may be provided with higher-quality (e.g., higher resolution, etc.) audiovisual content. Further, the client device may compare the bit-error rate being experienced during the application session to a threshold bit-error rate for the type of application in which the device is engaged. For instance, a threshold bit-error rate of one percent may be defined for audiovisual content. If the client device determines that it the current bit-error rate of the session is two percent, it may request that the server increase the FEC coding level. As another example, a tolerable bit-error rate of one percent might be defined for audiovisual content. Thus, if the client device determined that the bit-error rate was a half percent, the client device might request the FEC coding level be decreased (possibly allowing the server to increase content quality by increasing layer size, and/or the number of layers, without requiring additional bandwidth, or allowing the server to decrease the amount of bandwidth being used to transmit the content). Other examples are also possible.

Exemplary embodiments of the present invention have been described above. It should be understood the word "exemplary" is used herein to mean "serving as an example, instance, or illustration." Any embodiment described herein as "exemplary" is not necessarily to be construed as preferred or advantageous over other embodiments. In addition, those skilled in the art will understand that changes and modifications may be made to these exemplary embodiments without departing from the true scope and spirit of the invention, which is defined by the claims.

I claim:

1. A method for selecting a coding scheme for application-session content in an application session between a server and a client device, wherein the application-session content in the application session is received from the server via a communication path that comprises a wireless link, the method comprising:

at the client device, determining current values of one or more quality-of-service indicators, wherein the quality-of-service indicators are indicative of quality of service over the wireless link, and wherein determining the current values of the one or more quality-of-service indicators comprises:

(a) determining an amount of bandwidth that is currently available to the client device over the wireless link in the communication path; and (b) determining a current bit-error rate for application-session content received from the server; and the client device using the current values of the quality-of-service indicators as a basis for selecting a coding scheme that should be used by the server to encode forthcoming applicant-session content, wherein the application-session content comprises a plurality of data frames, wherein using the values of the one or more quality-of-service indicators as a basis for selecting the coding scheme comprises:

(a) using the determined amount of available bandwidth as a basis for selecting a content-quality level that should be used for the forthcoming application-session content, wherein the selected content-quality level is selected from a plurality of available content-quality levels, and wherein the selected content-quality level defines at least one of (i) a number of layers to include in each data frame and (ii) a size for each included layer; and (b) using the determined bit-error rate as a basis for selecting an amount of forward-error-correction that the server should provide for forthcoming applicant-session content.

2. The method of claim 1, further comprising, the client device requesting that the selected coding scheme be used to encode the forthcoming application-session content.

3. The method of claim 1, wherein the application-session content is initially encoded using a first coding scheme, the method further comprising:
- the client device making a determination as to whether or not the selected coding scheme is substantially the same as the first coding scheme; and
- if the determination is that the selected coding scheme is not substantially the same as the first coding scheme, then the client device requesting that the server use the selected coding scheme to encode the forthcoming application-session content.

4. The method of claim 1, wherein determining the current values of the one or more quality-of-service indicators comprises determining an amount of bandwidth that is currently available to the client device over the wireless link.

5. The method of claim 4, wherein using the current values of the one or more quality-of-service indicators as a basis for selecting the coding scheme comprises using the determined amount of available bandwidth as a basis for selecting a data format of a particular quality in which the server should provide the forthcoming application-session content.

6. The method of claim 1, wherein determining the current values of the one or more quality-of-service indicators comprises determining a current bit-error rate for application-session content received from the server.

7. The method of claim 6, wherein using the values of the one or more quality-of-service indicators as a basis for selecting the coding scheme comprises using the current bit-error rate as a basis for selecting an amount of forward-error-correction that the server should provide for forthcoming applicant-session content.

8. The method of claim 1, wherein the selected coding scheme is a multi-layer, two-dimensional coding scheme.

9. The method of claim 1, wherein each of the data frames comprises one or more layers of data, wherein each layer of data comprises one or more forward-error-correction codes.

10. The method of claim 9, wherein selecting a coding scheme that the server should use to encode forthcoming applicant-session content comprises selecting a forward-error-correction level from a plurality of available forward-error-correction levels, wherein the selected forward-error-correction level defines at least one of (a) a number of forward-error-correction codes to be included in each layer and (b) a size for each forward-error-correction code.

11. A method for selecting a coding scheme for application-session content in an application session between a server and a client device, wherein the application-session content is sent to the client device via a communication path that comprises a wireless link, the method comprising:
- at the server, receiving a request from the client device to use a given coding scheme to encode application-session content, wherein the application-session content comprises a plurality of data frames, wherein the coding scheme is selected by the client device based at least in part on current values of one or more quality-of-service indicators, and wherein the quality-of-service indicators are indicative of quality of service over the wireless link;
- wherein the quality-of-service indicators are determined by the client device based on: (a) a determination of an amount of bandwidth that is currently available to the client device over the wireless link in the communication path and (b) a determination of a current bit-error rate for application-session content sent by the server; and
- wherein the selection of the coding scheme is based on:
  - (a) a selection of a content-quality level to be used by the server for the application-session content, wherein the selection of the selected content-quality level is made from a plurality of available content-quality levels, wherein each of the content-quality levels defines at least one of (i) a number of layers to include in each data frame and (ii) a size for each included layer, and (b) a selection of an amount of forward-error-correction that the server should provide for the applicant-session content, wherein the selection of the amount of forward-error-correction is based on the current bit-error rate; and
- the server using the selected coding scheme to encode forthcoming application-session content to the client device.

12. A system configured to select a coding scheme for application-session content in an application session between a server and a client device, wherein application-session content in the application session is received from the server via a communication path that comprises a wireless link, the system comprising:
- a communication interface;
- a processor; and
- program code stored in data storage and executable by the processor to:
  - determine current values of one or more quality-of-service indicators, wherein the quality-of-service indicators are indicative of quality of service over the wireless link, wherein the program code stored in data storage and executable by the processor to determine the current values of the one more quality-of-service comprises program code that is executable by the processor to:
    - (a) determine an amount of bandwidth that is currently available to the client device over the wireless link in the communication path; and
    - (b) determine a current bit-error rate for application-session content received from the server;
  - use the current values of the quality-of-service indicators as a basis for selecting a coding scheme that should be used by the server to encode forthcoming applicant-session content, wherein the forthcoming application-session content comprises a plurality of data frames, and wherein the program code stored in data storage and executable by the processor to select the coding scheme comprises program code that is executable by the processor to:
    - (a) use the determined amount of available bandwidth as a basis for a selection of a content-quality level that should be used for the forthcoming application-session content, wherein the selected content-quality level is selected from a plurality of available content-quality levels, wherein the selected content-quality level defines at least one of (i) a number of layers to include in each data frame and (ii) a size for each included layer; and
    - (b) use the determined bit-error rate as a basis for a selection of an amount of forward-error-correction that the server should provide for forthcoming applicant-session content; and
  - send a request from the client device to the server via the communication interface to request that the server apply the selected coding scheme to the forthcoming application-session content.

13. The system of claim 12, wherein the one or more quality-of-service indicators comprise at least one of (a) an amount of bandwidth that is currently available to the client device over the wireless link and (b) a bit-error rate for application-session content received at the client device from the server.

14. The system of claim 12, wherein the system is further configured to connect via the communication interface using a WiMAX protocol, and wherein the wireless link comprises a WiMAX connection between the client device and a base station.

15. The system of claim 14, wherein the one or more quality-of-service indicators comprises a modulation and coding scheme being used for the WiMAX connection.

16. A system configured to select a coding scheme for application-session content in an application session between a server and a client device, the system comprising:
   a communication interface;
   a processor; and
   program code stored in data storage and executable by the processor to:
      send the application-session content to the client device via a communication path that comprises a wireless link;
      receive a request from the client device to use a given coding scheme to encode application-session content, wherein the application-session content comprises a plurality of data frames, wherein the coding scheme is selected by the client device based at least in part on current values of one or more quality-of-service indicators, and wherein the quality-of-service indicators are indicative of quality of service over the wireless link;
   wherein the quality-of-service indicators are determined by the client device based on: (a) a determination of an amount of bandwidth that is currently available to the client device over the wireless link in the communication path and (b) a determination of a current bit-error rate for application-session content sent by the server; and
   wherein the selection of the coding scheme is based on: (a) a selection of a content-quality level to be used by the server for the application-session content, wherein the selection of the selected content-quality level is made from a plurality of available content-quality levels, wherein each of the content-quality levels defines at least one of (i) a number of layers to include in each data frame and (ii) a size for each included layer, and (b) a selection of an amount of forward-error-correction that the server should provide for the applicant-session content, wherein the selection of the amount of forward-error-correction is based on the current bit-error rate; and
   encode the forthcoming application-session content to the client device using the selected coding scheme.

* * * * *